United States Patent
Sturm et al.

(10) Patent No.: US 9,538,686 B2
(45) Date of Patent: Jan. 3, 2017

(54) FAN COMPRISING A PRINTED CIRCUIT BOARD COOLING CIRCUIT

(71) Applicant: ebm-papst Mulfingen GmbH & Co. KG, Mulfingen (DE)

(72) Inventors: Michael Sturm, Bad Mergentheim (DE); Michael Eccarius, Mulfingen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 0 days.

(21) Appl. No.: 14/797,258

(22) Filed: Jul. 13, 2015

(65) Prior Publication Data

US 2016/0073550 A1    Mar. 10, 2016

(30) Foreign Application Priority Data

Sep. 5, 2014 (DE) .................. 10 2014 112 821

(51) Int. Cl.
| | |
|---|---|
| *H05K 7/20* | (2006.01) |
| *F04D 29/42* | (2006.01) |
| *F04D 29/58* | (2006.01) |
| *H02K 9/08* | (2006.01) |
| *F04D 25/06* | (2006.01) |

(52) U.S. Cl.
CPC ......... *H05K 7/20136* (2013.01); *F04D 25/068* (2013.01); *F04D 29/4226* (2013.01); *F04D 29/5813* (2013.01); *H02K 9/08* (2013.01); *H02K 11/33* (2016.01)

(58) Field of Classification Search
CPC ............ G06F 1/203; G06F 1/20; G06F 1/181; G06F 2200/201; H05K 1/141; H05K 7/20145; H05K 7/20136; H05K 7/20172; H05K 7/20572; H05K 7/20563; H05K 7/20754; F04D 25/068; F04D 29/5813; F04D 29/4226; H02K 11/33; H02K 9/08
See application file for complete search history.

(56) References Cited

U.S. PATENT DOCUMENTS

| | | | | |
|---|---|---|---|---|
| 5,132,780 | A * | 7/1992 | Higgins, III | .......... H01L 23/467 165/104.34 |
| 5,695,318 | A * | 12/1997 | Harmsen | ................. F04D 17/06 415/218.1 |
| 6,174,232 | B1 * | 1/2001 | Stoll | .................. H05K 7/20172 361/695 |

(Continued)

*Primary Examiner* — Adam B Dravininkas
(74) *Attorney, Agent, or Firm* — Harness, Dickey & Pierce, P.L.C.

(57) ABSTRACT

A fan includes a sealed electronics housing, in which a printed circuit board having electronic components is arranged. The electronics housing is divided into an upper region and a lower region. A cooling wheel which is arranged in the lower region is axially adjacent to the printed circuit board. The printed circuit board has at least one central opening and a plurality of peripheral-edge openings or gaps in order to bring the upper region into fluid communication with the lower region. Air is drawn out of the upper region into the lower region by the cooling wheel via the at least one central opening and, via the plurality of peripheral-edge openings or gaps. The air is fed back into the upper region. An air circuit having at least one air flow develops along a surface of the printed circuit board on which the electronic components are arranged.

13 Claims, 3 Drawing Sheets

(56) References Cited

U.S. PATENT DOCUMENTS

| | | | | |
|---|---|---|---|---|
| 6,196,300 B1* | 3/2001 | Checchetti | ............ | H01L 23/467 |
| | | | | 165/121 |
| 9,022,753 B2* | 5/2015 | Streng | .................... | F04D 25/082 |
| | | | | 417/366 |
| 2001/0036409 A1* | 11/2001 | Murata | ..................... | A47L 5/22 |
| | | | | 417/32 |
| 2006/0228237 A1* | 10/2006 | Winkler | ................ | F04D 19/002 |
| | | | | 417/423.1 |
| 2008/0089025 A1* | 4/2008 | Winkler | ................ | F04D 29/083 |
| | | | | 361/695 |
| 2008/0218011 A1* | 9/2008 | Cosco | .................... | H02K 29/08 |
| | | | | 310/71 |
| 2009/0142191 A1* | 6/2009 | Winkler | ................ | F04D 29/284 |
| | | | | 415/224 |
| 2012/0313466 A1* | 12/2012 | Eisert | .................... | F04D 25/082 |
| | | | | 310/62 |

\* cited by examiner

FAN COMPRISING A PRINTED CIRCUIT BOARD COOLING CIRCUIT

CROSS-REFERENCE TO RELATED APPLICATIONS

This application claims the benefit and priority of German Patent Application No. 10 2014 112 821.4, filed Sep. 5, 2014. The entire disclosure of the above application is incorporated herein by reference.

DESCRIPTION

The invention relates to a fan, in particular a radial fan, comprising a printed circuit board cooling circuit for cooling the electronic components installed on the printed circuit board.

From the prior art, it has long been known that it is important to cool electronic components on a printed circuit board in order to extend the service life thereof and to improve the power utilisation thereof. This is described for example in DE 20 2005 004 274 U1. The disclosed solution is beneficial in that air from outside can be guided to the printed circuit board via the inlet region, and circuit board can be cooled thereby. The printed circuit boards which have hitherto been used in the prior art are planar and do not comprise any openings or openings which are positioned in an undetermined manner in terms of manufacturing, for example for fixing to the housing or other components.

However, the following is a particular problem, and is one addressed by the present invention: providing defined cooling of the printed circuit board electronic components in a closed, sealed electronics housing in which it is not possible to exchange ambient air by exhaust air being let out and fresh air being taken in. Such housings which are closed in a sealed manner are used in fans in accordance with IP protection class (IPX4/IPX5 or higher), for example.

This problem is solved by the device and the method according to the combinations of features in claims 1 and 12.

According to the invention, a fan is proposed which comprises a tightly sealed electronics housing, in which a printed circuit board comprising electronic components is arranged, and the electronics housing is divided into an upper region and a lower region. The fan further comprises a cooling wheel which is arranged in the lower region so as to be indirectly or directly axially adjacent to the printed circuit board. The printed circuit board comprises at least one central opening and a plurality of peripheral-edge openings or peripheral-edge gaps in order to bring the upper region into fluid communication with the lower region. By means of the cooling wheel, air can be drawn out of the upper region into the lower region via the at least one central opening and, via the plurality of peripheral-edge openings or peripheral-edge gaps, can be fed back into the upper region from the lower region, wherein an air circuit having at least one air flow develops along a surface of the printed circuit board on which the electronic components are arranged.

When the air is sucked in by means of the cooling wheel through the at least one central opening in the printed circuit board, negative pressure develops in the upper region of the electronics housing. As a result, air is caused to flow back into the upper region from the lower region owing to the sealed design of the electronics housing, and this is facilitated by the peripheral-edge openings or peripheral-edge gaps. A defined, closed air circuit is produced from the cooling wheel which has a suction action on the at least one central opening in the lower region, radially outwards along the electronics housing and then via the peripheral-edge openings or peripheral edge gaps in the printed circuit board and back into the upper region, radially inwards along the surface of the printed circuit board in the upper region and back to the at least one central opening. While the air is flowing along the electronics housing, the air emits heat to the housing and therefore to the environment.

By means of this circulation of air, a cooling air circuit develops which leads to considerably better and more efficient cooling of the electronic components and thus the integrated electronics in comparison with directly blowing uncooled air onto the electronic components.

Openings in the printed circuit board, in the radial outer edge region thereof, are defined as peripheral-edge openings. Gaps on the radial edge of the printed circuit board are defined as peripheral-edge gaps. The housing, which is referred to as the electronics housing in the present case, receives at least the electronic components of the fan, but may also include parts of additional housing parts such as the impeller housing or motor housing, which mostly merge into each other or are formed by one component.

In an advantageous embodiment, peripheral-edge openings or peripheral-edge gaps are defined at positions on the printed circuit board which are radially further outwards from electronic components which get particularly hot (hotspots), so that the air flow from the peripheral-edge openings or peripheral-edge gaps sweeps radially inwards past the hotspots, and cools them to a particularly great extent. However, the invention also includes an embodiment in which the peripheral-edge openings and/or peripheral-edge gaps are defined over the entire radial edge region of the printed circuit board.

In an embodiment of the fan according to the invention, a ventilation slot is provided between the electronics housing and the radial edge of the printed circuit board, so that it is possible for air to flow around the entire radial edge of the printed circuit board from the lower region into the upper region.

The cooling capacity can be increased by various measures. In this case, both measures for flow optimisation and measures for improving heat dissipation are advantageous.

In an advantageous embodiment of the invention, it is provided that the cooling wheel comprises curved blades which are oriented in the rotational direction, increase the cooling flow of the air and measurably increase the cooling effect on the electronic components, in particular at high rotational speeds. This curvature may be both a forward curvature and a backward curvature of the blades, depending on the direction in which the cooling wheel mainly rotates when in use.

In order to increase the heat dissipation from the air flow which is axially sucked in and radially blown out by the cooling wheel, in an advantageous embodiment of the invention it is provided that cooling ribs are formed on the inner wall of the electronics housing in an integrally bonded manner, past which ribs the air which is blown out in the radial direction flows, and heat is emitted via the electronics housing. In a particularly advantageous embodiment, cooling ribs extend in this case in the radial direction with curvature, that is to say they are curved in plan view. The highest flow speeds and thus the greatest cooling effect is further achieved if the curvature of the cooling ribs is counter to the curvature of the blades of the cooling wheel, so that the blades and the cooling ribs form an S shape or inverted S shape in plan view, depending on the direction in which the cooling wheel is intended to rotate. In this case, the air flow is guided in the radial region adjoining the cooling wheel at a high flow pressure, radially outwards as far as the peripheral-edge openings or peripheral-edge gaps in the printed circuit board, so that heat can be dissipated to the electronics housing to as great an extent as possible and the air flow which is fed back to the upper region is cooled significantly.

For further flow optimisation, according to the invention the fan is characterised in that the cooling wheel comprises a conical suction region which is formed by the hub of said wheel. In this case, the suction region can be defined by the hub shape of the cooling wheel. Furthermore, it is advantageous for an inlet nozzle which is directed towards the cooling wheel to be formed on the at least one central opening in the printed circuit board or to be arranged thereon as an additional component. In an embodiment, the inlet nozzle is provided through a contact-protection device arranged between the cooling wheel and the printed circuit board in order to protect the printed circuit board, which device prevents electrostatically generated voltages from reaching and damaging the electronics. In this case, the contact-protection device advantageously comprises an opening which is axially flush with the at least one central opening and on which the inlet nozzle which is directed towards the cooling wheel is formed. Irrespective of where or by which component the inlet nozzle is formed, a configuration and arrangement of the cooling wheel is preferred in which the conical suction region of the cooling wheel projects axially into the inlet nozzle. As a result, greater flow speeds or volumetric flow rates can be achieved in the suction region of the cooling wheel in accordance with the nozzle/diffuser principle, and the dynamic pressure at the peripheral-edge openings or peripheral-edge gaps in the printed circuit board is increased. In this case, the negative pressure in the upper region of the electronics housing decreases further and the overpressure in the lower region increases. The greater the pressure differential between the upper region and lower region, the more heat emitted to the electronics housing and the cooling ribs thereof and the greater the cooling capacity.

An embodiment of the printed circuit board of the fan is preferred in which a surface area of the at least one central opening is 5 to 50 times greater, more preferably 10 to 30 times greater, than a surface area of a peripheral-edge opening or a peripheral-edge gap, in order to achieve sufficiently high suction at high flow speeds through the peripheral-edge openings or peripheral-edge gaps in the printed circuit board.

The invention further includes embodiments in which a plurality of central openings are provided which each have a surface area which substantially corresponds to a surface area of a peripheral-edge opening or a peripheral-edge gap. The openings can thus all be made using the same tool.

In an embodiment of the invention, the fan also comprises a drive shaft which can be driven by a motor and has a fan wheel arranged thereon, the cooling wheel also being fastened to the drive shaft, in particular in an axial end portion of the drive shaft.

The cooling wheel can be further improved both acoustically and aerodynamically by a cover disc being provided in the region of the blades.

The invention also relates to the method for cooling electronic components arranged on the printed circuit board of the fan, wherein the printed circuit board is fastened in the electronics housing of the fan which is closed in an airtight manner and the electronics housing is divided into an upper region and a lower region, wherein the printed circuit board comprises at least one central opening and a plurality of peripheral-edge openings or peripheral-edge gaps in order to bring the upper region into fluid communication with the lower region, and, by means of the cooling wheel, air is drawn out of the upper region into the lower region via the at least one central opening and, via the plurality of peripheral-edge openings or peripheral-edge gaps, is fed back into the upper region, wherein an air circuit having at least one air flow is generated along a surface of the printed circuit board on which the electronic components are arranged.

Moreover, all the method-related features set out above for the fan can be integrated into the method according to the invention without said features having to be repeated as method steps.

Other advantageous developments of the invention are characterised in the dependent claims or are set out in the following together with the description of the preferred configuration of the invention on the basis of the drawings, in which:

The drawings are schematic by way of example and serve to provide a better understanding of embodiments of the invention. In all the views, identical parts are provided with identical reference numerals.

Figure 1:
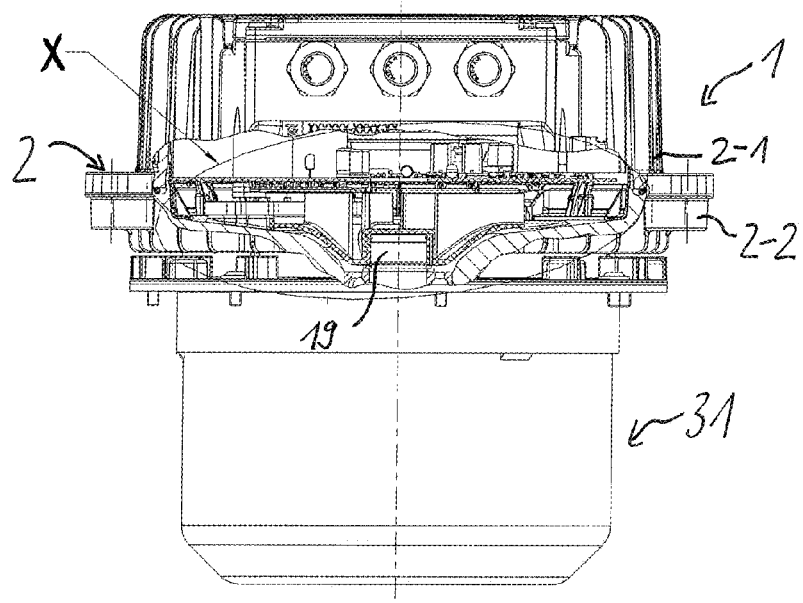
FIG. 1 is a partially sectional side view of a fan according to the invention.
Figure 2:
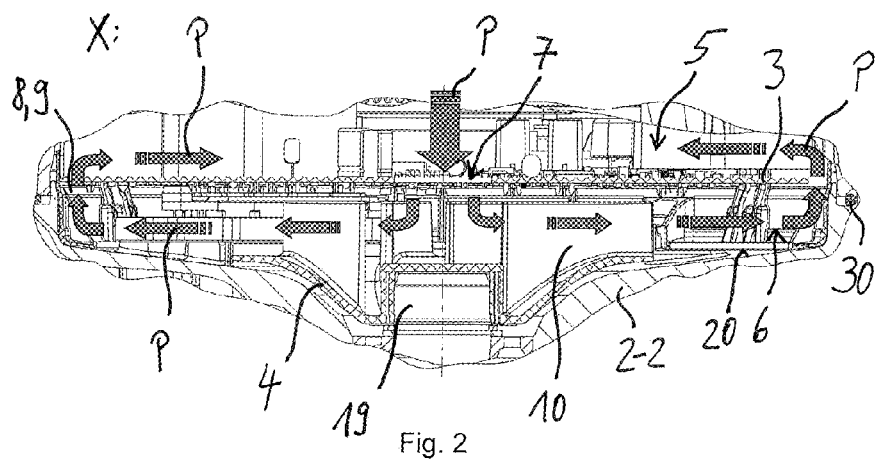
FIG. 2 is a detail X from FIG. 1.

FIG. 1 is a partially sectional side view of the fan 1 according to the invention. FIG. 2 shows the detail denoted by X in greater detail and in an enlarged manner. The fan 1 comprises a motor which is received in a motor housing 31 and drives a fan wheel (not shown) and a cooling wheel 4 in rotation via a drive shaft 19. A printed circuit board 3 comprising various electronic components is arranged in an electronics housing 2 which is formed by a lower housing 2-2 and a housing cover 2-1 and is closed off from the environment in a sealed manner via the seal 30, which printed circuit board divides the electronics housing 2 into an upper region 5 and a lower region 6. In this case, the lower region 6 is determined as the region on the side of the cooling wheel 4, and the upper region 5 is determined as the region on the side of the printed circuit board 3 which is opposite the cooling wheel 4. The printed circuit board 3 comprises a central opening 7 in the centre, through which the upper region 5 is in fluid communication with the lower region 6, so that air can be sucked out of the upper region 5 into the lower region 6 via rotation of the cooling wheel 4. On its radial edge, the printed circuit board 3 comprises a plurality of peripheral-edge openings 8 and peripheral-edge gaps 9, which can be seen more clearly in FIG. 5. This also ensures fluid communication between the upper region 5 and the lower region 6, so that the air which is axially sucked in by the cooling wheel 4 via the central opening 7 can first be blown along the inner wall 20 of the lower housing 2-2 in the radial direction outwards towards the radial edge region of the printed circuit board 3 and then can be fed back into the upper region 5 via the peripheral-edge openings 8 and peripheral-edge gaps 9. In this process, a cooling circuit of air indicated by the arrow P develops, in which circuit the air flows in the upper region 5 along the surface of the printed circuit board 3 comprising the electronic components and cools said components. While the air is flowing in the lower region 6 along the lower housing 2-2, it emits heat to the lower housing 2-2 and thus indirectly to the external environment. The air which has been cooled and fed back into the upper region 5 can again absorb heat from the hot electronic components on the printed circuit board 3 and cool them in the process. It is not possible to exchange the air owing to the sealed configuration of the electronics housing 2. The cooling wheel 4 comprises a plurality of curved blades 10 which are oriented in the rotational direction and is fastened or fitted to the axial end of the drive shaft 19 of the motor.

Figure 3:
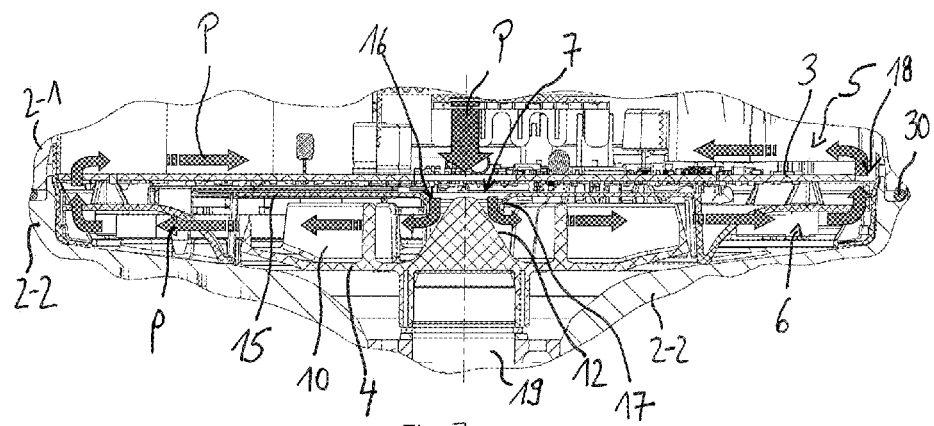
FIG. 3 is a partial sectional view of an alternative configuration.

FIG. 3 corresponds to the configuration in FIG. 1, but a contact-protection device 15 in the form of a lattice element is arranged between the cooling wheel 4 and the printed circuit board 3, which device comprises an opening 16 which is axially flush with the central opening 7 so that air can be sucked out of the upper region 5 into the lower region 6 via the cooling wheel 4. An inlet nozzle 17 which is directed towards the cooling wheel 4 is formed on the opening 16, which nozzle cooperates in terms of flow with a conical suction region 12 formed on the hub of the cooling wheel 4 and ensures a nozzle effect whereby the flow speed of the air increases in the direction of the arrow P. The conical suction region 12 of the cooling wheel 4 projects into the inlet nozzle 17 in the axial direction. In the configuration shown, the inlet nozzle 17 is formed in one piece with the contact-protection device 15. In the configuration shown, a ventilation slot 18 is provided between the printed circuit board 3 electronics housing 2, which slot ensures that air flows around the entire outer edge of the printed circuit board 3.

Figure 4:
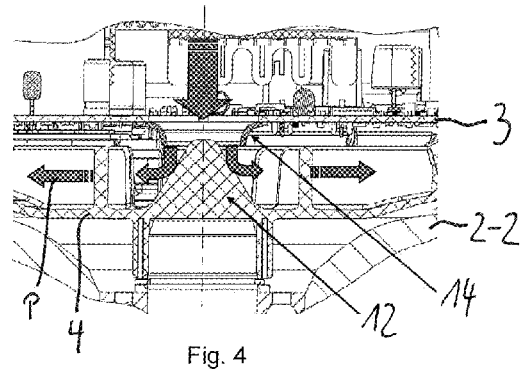
FIG. 4 is a partial sectional view of another alternative configuration.

FIG. 4 shows a further alternative embodiment to the fan 1 from FIGS. 1 and 2, an inlet nozzle 14 being directly placed on the printed circuit board 3 as an additional component. As in FIG. 3, the cooling wheel 4 comprises a conical suction region 12, which cooperates with the inlet nozzle 14. Of course, an inlet nozzle may also be directly formed on the printed circuit board 3, as is the case for the contact-protection device 15 according to FIG. 3.

Figure 5:
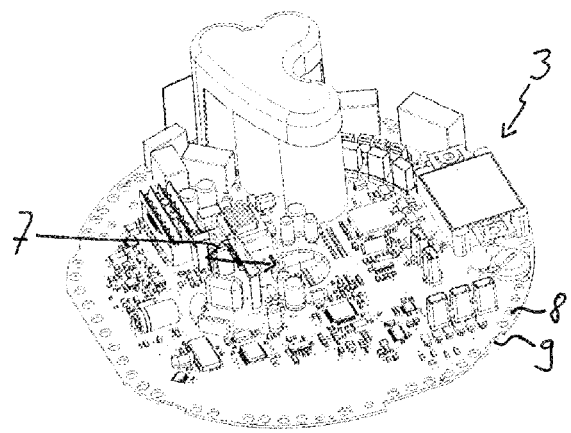
FIG. 5 is a perspective view of a printed circuit board.

The exemplary printed circuit board 3 shown in perspective view in FIG. 5 shows the central opening 7 as one large opening. Alternatively, a plurality of small openings can also cooperate in the central region as a central opening 7, provided that the cooling wheel 4 can suck air out of the upper region 5 into the lower region 6 with reasonable efficiency. A plurality of peripheral-edge openings 8 and peripheral-edge gaps 9 of different shapes and sizes are positioned on the radial edge of the printed circuit board 3, which openings and gaps can be defined on the surface of the printed circuit board 3 depending on the required cooling of the individual components. In the embodiment shown, the central opening is of a size which approximately corresponds to 25 times the size of a peripheral-edge opening 8.

Figure 6:
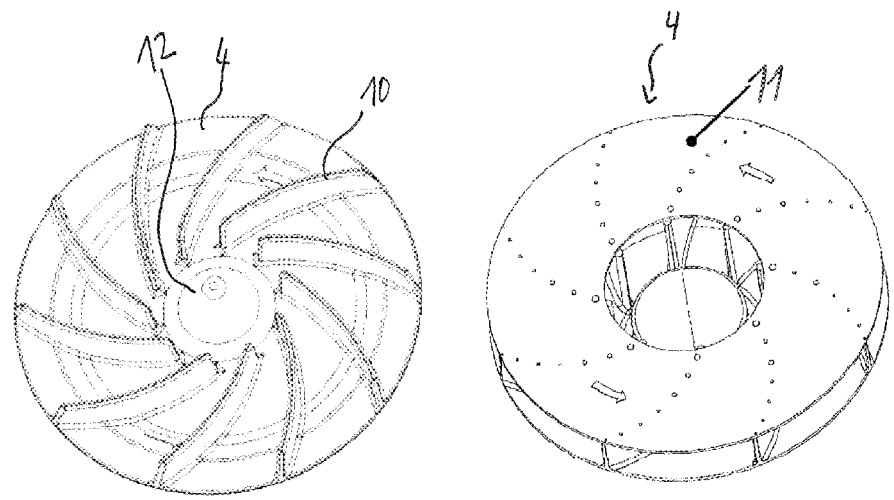
FIG. 6 shows two configurations of cooling wheels.
Figure 7:
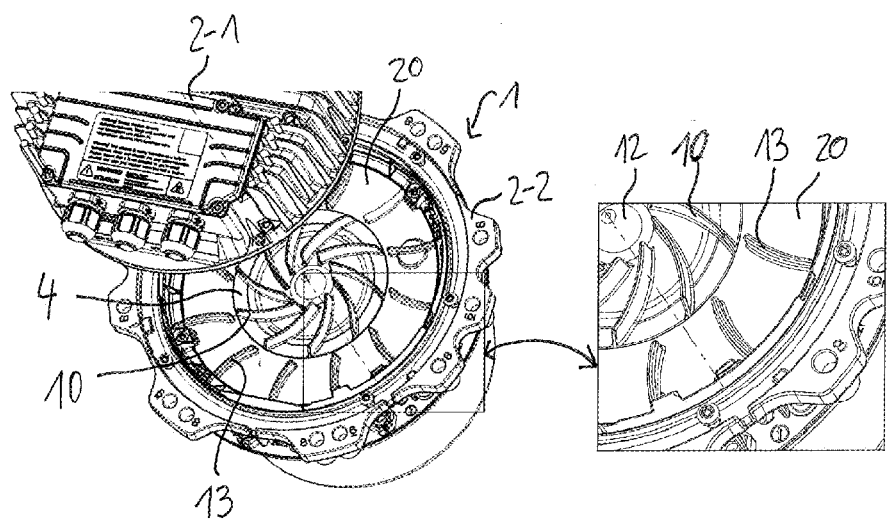
FIG. 7 is a perspective view of a fan, together with an additional partial enlarged view.

FIG. 6 shows two exemplary embodiments of flow-optimised, one-piece cooling wheels 4 comprising backward-curved blades 10, the embodiment of the cooling wheel 4 on the right-hand side also having a cover disc 11. The cooling wheel 4 on the left-hand side is inserted into the fan 1 in the perspective view in FIG. 7, the cover housing 2-1 being shown so as to be lifted off for the purposes of clearer illustration. In the enlarged view in FIG. 7, integrally bonded cooling ribs 13 can be seen on the inner wall 20 of the lower housing 2-2, along which ribs the air which is blown out in the radial direction by the cooling wheel 4 can flow, and heat is emitted to the lower housing 2-2 of the electronics housing 2. The cooling ribs 13 extend in a curved manner in the radial direction, the curvature of the cooling ribs 13 being counter to a curvature of the blades 10 of the cooling wheel 4, so that the blades 10 and the cooling ribs 13 together form an inverted S shape in plan view. Alternatively, the blades and cooling ribs may also be curved in reverse and form an S shape in plan view. The printed circuit board 3 is not shown for reasons of clarity.

The configuration of the invention is not limited to the preferred embodiments set out above. Instead, a number of variants are conceivable which also make use of the solution set out in essentially different configurations. For example, the cooling wheel according to FIG. 1 may also be provided with a cooling wheel according to FIG. 3.

The invention claimed is:

1. A fan comprising:
   a tightly sealed electronics housing, in which a printed circuit board comprising electronic components is arranged, the electronics housing being divided into an upper region and a lower region, and
   a cooling wheel arranged in the lower region so as to be axially adjacent to the printed circuit board, wherein
   the printed circuit board comprises at least one central opening and a plurality of peripheral-edge openings or peripheral-edge gaps in order to bring the upper region into fluid communication with the lower region,
   the cooling wheel causes air to be drawn out of the upper region into the lower region via the at least one central opening and, via the plurality of peripheral-edge openings or peripheral-edge gaps,
   the air is fed back into the upper region, wherein an air circuit having at least one air flow develops along a surface of the printed circuit board on which the electronic components are arranged; and
   the cooling wheel comprises a conical suction region which projects axially into an inlet nozzle directed towards the cooling wheel.

2. The fan according to claim 1, wherein
   a contact-protection device is arranged between the cooling wheel and the printed circuit board in order to protect the printed circuit board, and
   the contact-protection device comprises an opening which is axially flush with the at least one central opening, and the inlet nozzle which is directed towards the cooling wheel is formed or arranged on the opening.

3. The fan according to claim 1, wherein
   an inlet nozzle is directed towards the cooling wheel, the inlet nozzle is formed or arranged on the at least one central opening in the printed circuit board.

4. The fan according to claim 1, wherein the cooling wheel comprises curved blades which are oriented in the rotational direction and/or a cover disc.

5. The fan according to claim 1, wherein the air is sucked in the axial direction via the cooling wheel and blown out in the radial direction along an inner wall of the electronics housing, cooling ribs being formed on the inner wall of the electronics housing in an integrally bonded manner, along which ribs the air which is blown out in the radial direction can flow, and heat can be emitted via the electronics housing.

6. The fan according to claim 5, wherein the cooling ribs extend in the radial direction with curvature.

7. The fan according to claim 6, wherein the curvature of the cooling ribs is counter to a curvature of the blades of the cooling wheel, so that the blades and the cooling ribs form an S shape or inverted S shape in a plan view.

8. The fan according to claim 1, wherein a ventilation slot is provided between the electronics housing and a radial edge of the printed circuit board.

9. The fan according to claim 1, wherein a surface area of the at least one central opening is 5 to 50 times greater than a surface area of a peripheral-edge opening or a peripheral-edge gap.

10. The fan according to claim 1, wherein a plurality of central openings are provided, each of the plurality of central openings having a surface area which corresponds to a surface area of a peripheral-edge opening or a peripheral-edge gap.

11. The fan according to claim 1, wherein said fan comprises a drive shaft which can be driven by a motor and a fan wheel arranged thereon, and the cooling wheel is fastened to the drive shaft.

12. A method for cooling electronic components arranged on a printed circuit board of a fan, wherein the printed circuit board is fastened in an electronics housing of the fan which is closed in an airtight manner and the electronics housing is divided into an upper region and a lower region, wherein the printed circuit board comprises at least one central opening and a plurality of peripheral-edge openings and/or peripheral-edge gaps in order to bring the upper region into fluid communication with the lower region, and, the method comprising:

drawing air by using a cooling wheel out of the upper region into the lower region via the at least one central opening and, via the plurality of peripheral-edge openings and/or peripheral-edge gaps, and feeding back the air into the upper region, wherein an air circuit having at least one air flow is generated along a surface of the printed circuit board on which the electronic components are arranged.

13. The method according to claim 12, wherein the cooling wheel comprises curved blades which are oriented in the rotational direction and sucks in the air in an axial direction and blows out air in a radial direction along an inner wall of the electronics housing, cooling ribs being formed on the inner wall of the electronics housing in an integrally bonded manner, against the cooling ribs, the method further comprising:

blowing the air drawn by the cooling wheel so that heat from the air can be emitted at the electronics housing.

* * * * *